(12) United States Patent
Kawamura

(10) Patent No.: US 10,890,627 B2
(45) Date of Patent: Jan. 12, 2021

(54) GROUND FAULT DETECTION APPARATUS

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/515,192

(22) Filed: Jul. 18, 2019

(65) Prior Publication Data
US 2020/0064388 A1    Feb. 27, 2020

(30) Foreign Application Priority Data

Aug. 23, 2018 (JP) ................................. 2018-155976

(51) Int. Cl.
*G01R 31/50* (2020.01)
*G01R 1/02* (2006.01)

(52) U.S. Cl.
CPC .............. *G01R 31/50* (2020.01); *G01R 1/02* (2013.01)

(58) Field of Classification Search
CPC .. B60L 3/0046; B60L 3/0069; B60L 2240/80; G01R 27/025; G01R 1/006; G01R 1/007; G01R 1/02; G01R 1/024; G01R 1/025; G01R 1/1272; G01R 1/14; G01R 1/327; G01R 1/3275; G01R 1/3277; G01R 1/3278; G01R 1/382; G01R 1/40; G01R 1/50
USPC .......................... 324/503, 509, 510, 551, 557
See application file for complete search history.

(56) References Cited

U.S. PATENT DOCUMENTS

| 4,387,306 | A | * | 6/1983 | Sibley | ................ | G01R 31/3278 307/125 |
| 4,762,663 | A | * | 8/1988 | Cook | ................... | H01H 47/002 376/259 |
| 5,818,236 | A | * | 10/1998 | Sone | ...................... | B60L 3/0023 324/509 |
| 6,459,241 | B1 | * | 10/2002 | Yang | ...................... | H02J 7/0047 320/132 |
| 8,248,744 | B2 | * | 8/2012 | Kawamura | ........ | G01R 19/0084 361/79 |

(Continued)

FOREIGN PATENT DOCUMENTS

JP    2011-017586 A    1/2011

*Primary Examiner* — Steven L Yeninas
(74) *Attorney, Agent, or Firm* — Sughrue Mion, PLLC

(57) ABSTRACT

A ground fault detection apparatus is configured to be connected to an ungrounded battery for supplying power to a load via a step-up circuit and to detect ground fault by calculating an insulation resistance of a system provided with the battery, and includes a capacitor that operates as a flying capacitor, a set of switches that switch between a first voltage measurement path including the battery and the capacitor, a second voltage measurement path including the battery, the capacitor and a negative-electrode-side insulation resistor as an insulation resistor between a negative-electrode side of the battery and a ground, a third voltage measurement path including the battery, the capacitor and a positive-electrode-side insulation resistor as an insulation resistor between a positive-electrode side of the battery and the ground, and a capacitor charge voltage measurement path, and a pair of Form C contact relays that can reverse connection direction of the capacitor.

7 Claims, 10 Drawing Sheets

(56) References Cited

U.S. PATENT DOCUMENTS

| | | | | |
|---|---|---|---|---|
| 2010/0156426 A1* | 6/2010 | Kang | ............... | B60L 3/12 |
| | | | | 324/444 |
| 2011/0006781 A1* | 1/2011 | Kawamura | ............ | G01R 31/52 |
| | | | | 324/551 |
| 2013/0182361 A1* | 7/2013 | Sexton | ............... | H02H 11/002 |
| | | | | 361/79 |
| 2015/0293167 A1* | 10/2015 | Kawamura | ............ | B60L 3/0069 |
| | | | | 324/551 |
| 2018/0315565 A1* | 11/2018 | Zhang | ............... | G01R 31/3278 |

* cited by examiner

REVERSED POLARITY CHARGE VOLTAGE MEASUREMENT PATH

US 10,890,627 B2

GROUND FAULT DETECTION APPARATUS

TECHNICAL FIELD

The present invention relates to a ground fault detection apparatus using a flying capacitor.

BACKGROUND

In a vehicle such as a hybrid car, which includes an engine and an electric motor as driving sources, and an electric vehicle, a battery mounted on a vehicle body is charged, and driving power is generated with use of electric energy supplied from the battery. In general, a power supply circuit related to the battery is configured as a high-voltage circuit using as high voltage as 200V or higher, and for ensuring safety, the high-voltage circuit including the battery is in an ungrounded configuration in which the high-voltage circuit is electrically insulated from a vehicle body serving as a reference potential point of a ground.

Further, there is a vehicle including a booster configured to step up a positive electric potential of a battery and supply it to a load to improve a drive efficiency of the load. In the vehicle including the booster, an output side of the battery, i.e., a primary side of the booster and an output side of the booster, i.e., the secondary side of the booster are in the ungrounded configuration in which they are electrically insulated from a vehicle body, thus the vehicle is not used as a ground for the battery and the booster. Thus, the vehicle including the booster requires detecting an insulation resistance between the battery and a ground and also an insulation resistance between the secondary side of the booster and the ground to monitor a ground fault state.

Thus, a ground fault detection apparatus is provided to monitor a ground fault state between the vehicle body and a system provided with the battery and the booster, specifically, a main power supply system ranging from the battery through the booster to the load such as an electric motor. As the ground fault detection apparatus, one of a type using a capacitor called a flying capacitor is widely used.

FIG. 9 is a block diagram showing a configuration example of a conventional ground fault detection apparatus 500 of the flying capacitor type. The ground fault detection apparatus 500 is connected to an ungrounded battery B and is configured to detect a ground fault of a system provided with the battery B and a booster 520. The ground fault detection apparatus 500, the booster 520 and a load 540 and such are controlled by an external control device as a host device not shown.

Herein, an insulation resistance between a positive electrode on an output side of the battery B, i.e., a primary side, and a ground is referred to as RLp1, and an insulation resistance between a negative electrode and the ground is referred to as RLn1. Further, an insulation resistance between the positive electrode on an output side of the booster 520, i.e., a secondary side, and a ground is referred to as RLp2, and an insulation resistance between the negative electrode and the ground is referred to as RLn2. A positive electrode-side insulation resistance RLp is a combined resistance of the resistances RLp1 and RLp2, and a negative electrode-side insulation resistance RLn is a combined resistance of the resistances RLn1 and RLn2. A combined resistance of the positive electrode-side insulation resistance RLp and the negative electrode-side insulation resistance RLn corresponds to an insulation resistance RL.

A capacitor C1 functioning as a flying capacitor is charged in a path formed by turning on and off of switches S1-S4, and its charge voltage is measured by a control device 510.

As a method for acquiring the insulation resistance RL, a technology is known in which V0, Vcn and Vcp are measured, (Vcn+Vcp)/V0 is calculated, and based on the obtained calculated value, the insulation resistance RL is obtained with referring to a pre-produced table data. The ground fault detection apparatus 500 determines that there is a ground fault occurring when the obtained insulation resistance RL is below a predetermined reference value, and outputs a warning to the external control device.

Herein, V0 is a value corresponding to a voltage of the battery B measured with a path formed by turning on the switch S1 and the switch S2. Of electrode plates of the capacitor C1, one connected to the positive electrode side of the battery B is referred to as a first electrode plate, and one connected to the negative electrode side of the battery B is referred to as a second electrode plate.

Vcn is a voltage value measured with a charge path on the positive electrode side of the battery B formed by turning on the switch S1 and the switch S4, and is a voltage value having the effect of the negative electrode-side insulation resistance RLn. Vcp is a voltage value measured with a charge path on the negative electrode side of the battery B formed by turning on the switch S2 and the switch S3, and is a voltage value having the effect of the positive electrode-side insulation resistance RLp.

In general, in a ground fault determination, measurement is performed with one cycle including a V0 measurement, a Vcn measurement, a V0 measurement and a Vcp measurement, and at the time of switching of each measurement, a charge voltage of the capacitor C1 is read out and discharge of the capacitor C1 is performed with a path formed by turning on the switch S3 and the switch S4.

When measuring Vcn by turning on the switch S1 and the switch S4 while the booster 520 is performing a step up operation, a voltage obtained by dividing a stepped up voltage by the positive electrode-side insulation resistance RLp and the negative electrode-side insulation resistance RLn is applied to the second electrode plate of the capacitor C1.

When this voltage becomes greater than a voltage applied from the positive electrode side of the battery B, the capacitor C1 will be charged with a polarity reversed to the normal polarity due to current flowing around. That is, the second electrode plate side will have a higher electrical potential. In this case, a voltage measure by the control device 510 becomes zero, thus the insulation resistance RL cannot be calculated.

To address this problem, Patent Document 1 listed below discloses a ground detection apparatus 600 including a negative potential measurement circuit 620 as shown in FIG. 10. Here, the negative potential measurement circuit 620 includes a diode Da, a resistor Ra, a switch Sa constituted of a photo MOS-FET and a resistor Rb. In addition, the ground detection apparatus 600 includes a switch S5 and a resistor R5.

When a capacitor C1 is charged with a polarity reverse to the normal polarity during the measurement of Vcn, the ground detection apparatus 600 measures a charge voltage of the capacitor C1 using an A/D1 of a control device 610 by turning on a switch S5 and the switch Sa, instead of measuring the charge voltage of the capacitor C1 with the A/D1 of the control device 610 by turning on a switch S3 and a switch S4. As such, the charge voltage of the capacitor C1 charged with the reversed polarity can be measured, and the insulation resistance RL can be calculated.

PRIOR ART DOCUMENT

Patent Document
Patent Document 1: JP 2011-17586 A

SUMMARY OF THE INVENTION

In Patent Document 1, by providing the negative potential measurement circuit including the diode, the resistors and the switches, it is possible to measure the charge voltage of the capacitor in the ground fault detection apparatus of the system having the booster even if the flying capacitor is charged with the reversed polarity. However, since the photo MOS-FET used as the switch in the negative potential measurement circuit is expensive, a cost of the ground fault detection apparatus is increased.

In view of the above-described background, an object of the present invention is to provide a ground fault detection apparatus of a system having a booster which can perform a measurement of a charge voltage of a flying capacitor inexpensively even when the flying capacitor is charged with a reversed polarity.

Solution to Problem

To achieve the above-described object, the present invention provides, in one aspect, a ground fault detection apparatus configured to be connected to an ungrounded battery for supplying power to a load via a step-up circuit, and configured to detect a ground fault by calculating an insulation resistance of a system provided with the battery, the ground fault detection apparatus including a capacitor configured to operate as a flying capacitor, a set of switches configured to switch between a first voltage (V0) measurement path including the battery and the capacitor, a second voltage (Vcn) measurement path including the battery, the capacitor and a negative electrode-side insulation resistor as an insulation resistor between a negative electrode side of the battery and a ground, a third voltage (Vcp) measurement path including the battery, the capacitor and a positive electrode-side insulation resistor as an insulation resistor between a positive electrode side of the battery and the ground, and a capacitor charge voltage measurement path, and a pair of Form C contact relays configured to reverse a connection direction of the capacitor. Herein, a contact point c of each of the pair of Form C contact relays may be connected to the capacitor side, and a contact point a and a contact point b of one of the pair of Form C contact relays may be connected to a contact point b and a contact point a of another one of the pair of Form C contact relays, respectively. Further, when a measured value of the charge voltage of the capacitor in the second voltage (Vcn) measurement path can be regarded as zero, the pair of Form C contact relays can be switched to reverse the connection direction of the capacitor. Further, the pair of Form C contact relays may be constituted of a twin relay. Further, the set of switches is constituted of two Form C contact relays.

Advantageous Effects of the Invention

According to the present invention, a ground fault detection apparatus of a system having a booster is provided in which a measurement of a charge voltage of a flying capacitor can be performed at a low cost even when the flying capacitor is charged with a reversed polarity.

DETAILED DESCRIPTION OF THE EXEMPLARY EMBODIMENTS

Figure 1:
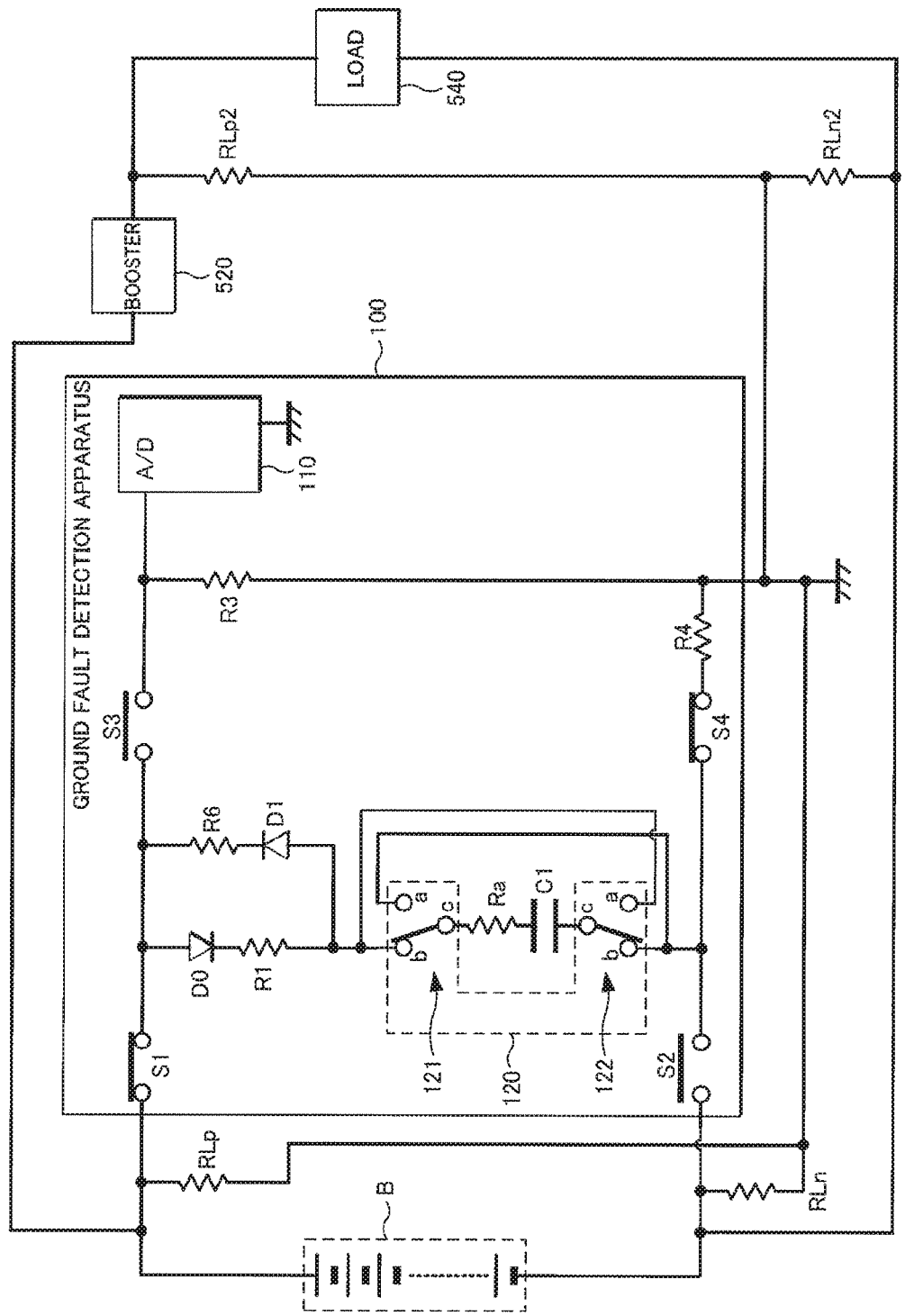
FIG. 1 is a block diagram of a ground fault detection apparatus according to one embodiment of the present invention.

In the following, a ground fault detection apparatus according to one embodiment of the present invention will be explained with reference to the drawings. FIG. 1 is a block diagram of a ground fault detection apparatus 100 according to one embodiment. The ground fault detection apparatus 100 is configured to be connected to an ungrounded battery B for supplying power to a load 540 and is configured to detect a ground fault of a system provided with the battery B and a booster 520. The ground fault detection apparatus 100, the booster 520 and the load 540 and such are controlled by an external control device as a host device not shown.

Herein, an insulation resistance between a positive electrode on an output side of the battery B, i.e., a primary side, and a ground is referred to as RLp1, and an insulation resistance between a negative electrode and the ground is referred to as RLn1. Further, an insulation resistance between the positive electrode on an output side of the booster 520, i.e., a secondary side, and a ground is referred to as RLp2, and an insulation resistance between the negative electrode and the ground is referred to as RLn2. A positive electrode-side insulation resistance RLp is a combined resistance of the resistances RLp1 and RLp2, and a negative electrode-side insulation resistance RLn is a combined resistance of the resistances RLn1 and RLn2. A combined resistance of the positive electrode-side insulation resistance RLp and the negative electrode-side insulation resistance RLn corresponds to an insulation resistance RL of the system.

The battery B is constituted of a chargeable battery such as a lithium-ion battery, and the positive electrode side of the battery B is connected to the load 540 such as an electric motor via the booster 520, and the negative electrode side of the battery B is connected to the load 540.

As shown in FIG. 1, the ground fault detection apparatus 100 includes a capacitor C1 functioning as a flying capacitor. As the capacitor C1, a ceramic condenser may be used, for example.

In this embodiment, a pair of Form C contact relays 121, 122 is connected to both electrode plates of the capacitor C1 to enable reversing the connection direction of the capacitor C1.

Specifically, a contact point "c" of the Form C contact relay 121 is connected to a first electrode plate of the capacitor C1, and a contact point "c" of the Form C contact relay 122 is connected to a second electrode plate of the capacitor C1. The Form C contact relays 121, 122 may be constituted of a high breakdown voltage and low signal mechanical relay or a reed relay, for example.

The first electrode plate of the capacitor C1 and the contact point "c" of the Form C contact relay 121 are connected via a resistor Ra. The resistor Ra is used as a protective resistor for preventing a short circuit in an abnormal relay operation and is used as a discharge resistor with a resistor R3, a resistor R4 and a resistor R6 connected in series. For example, the resistor Ra may be configured such that Ra<<R1, R6, or it may be omitted.

As shown in FIG. 1, a contact point "a" of the Form C contact relay 121 and a contact point "b" of the Form C contact relay 122 are connected, while a contact point "b" of the Form C contact relay 121 and a contact point "a" of the Form C contact relay 122 are connected. As described later, since the Form C contact relay 121 and the Form C contact relay 122 perform switching in conjunction with each other, it is preferable to constitute the Form C contact relay 121 and the Form C contact relay 122 as a twin relay 120 configured to be switched simultaneously with one control. The Form C contact relay 121, the Form C contact relay 122 and the twin relay 120 are very inexpensive compared to a photo MOS-FET.

The ground fault detection apparatus 100 includes four switches S1-S4 arranged around the capacitor C1 to switch measurement paths and to control charge and discharge of the capacitor C1. These switches may be constituted of switching elements of insulated type such as photo MOS-FETs.

The switch S1 has one end connected to the positive electrode of the battery B and another end connected to an anode side of a diode D0 and to one end of the resistor R6. A cathode side of the diode D0 is connected to one end of the resistor R1, and another end of the resistor R6 is connected to a cathode of a diode D1. Another end of the resistor R1 and an anode side of the diode D1 are connected to the contact point "b" of the Form C contact relay 121.

The switch S2 has one end connected to the negative electrode of the battery B and another end connected to the contact point "b" of the Form C contact relay 122.

The switch S3 has one end connected to the anode side of the diode D0 and to the one end of the resistor R6, and another end connected to one end of the resistor R3 and to an A/D port of a control device 110. Another end of the resistor R3 is grounded.

The switch S4 has one end connected to the contact point "b" of the Form C contact relay 122 and another end connected to one end of the resistor R4. Another end of the resistor R4 is grounded.

The control device 110 is constituted of a microcomputer and such and controls various operations of the ground fault detection apparatus 100 by executing a program embedded in advance. Specifically, the control device 110 individually controls the switches S1-S4 and the twin relay 120 to switch the measurement paths and controls charge and discharge of the capacitor C1.

Further, the control device 110 inputs from the A/D port an analog level corresponding to a charge voltage of the capacitor C1, performs a predetermined calculation based on this value, and calculates the insulation resistance RL. A measurement data of the control device 110 and a warning and such indicative of detection of ground fault are outputted to the external control device.

The following will explain an operation of the ground fault detection apparatus 100 having the above-described configuration. The ground fault detection apparatus 100 repeats a measurement operation with one cycle including a V0 measurement period, a Vcp measurement period, a V0 measurement period and a Vcn measurement period, for example. In each of the measurement periods, the capacitor C1 is charged with a voltage of an object to be measured, and then a charge voltage of the capacitor C1 is measured. Then, the capacitor C1 is discharged for a next measurement. It is noted that the twin relay 120 is switched to the contact point "b" side in an initial state.

Figure 2:
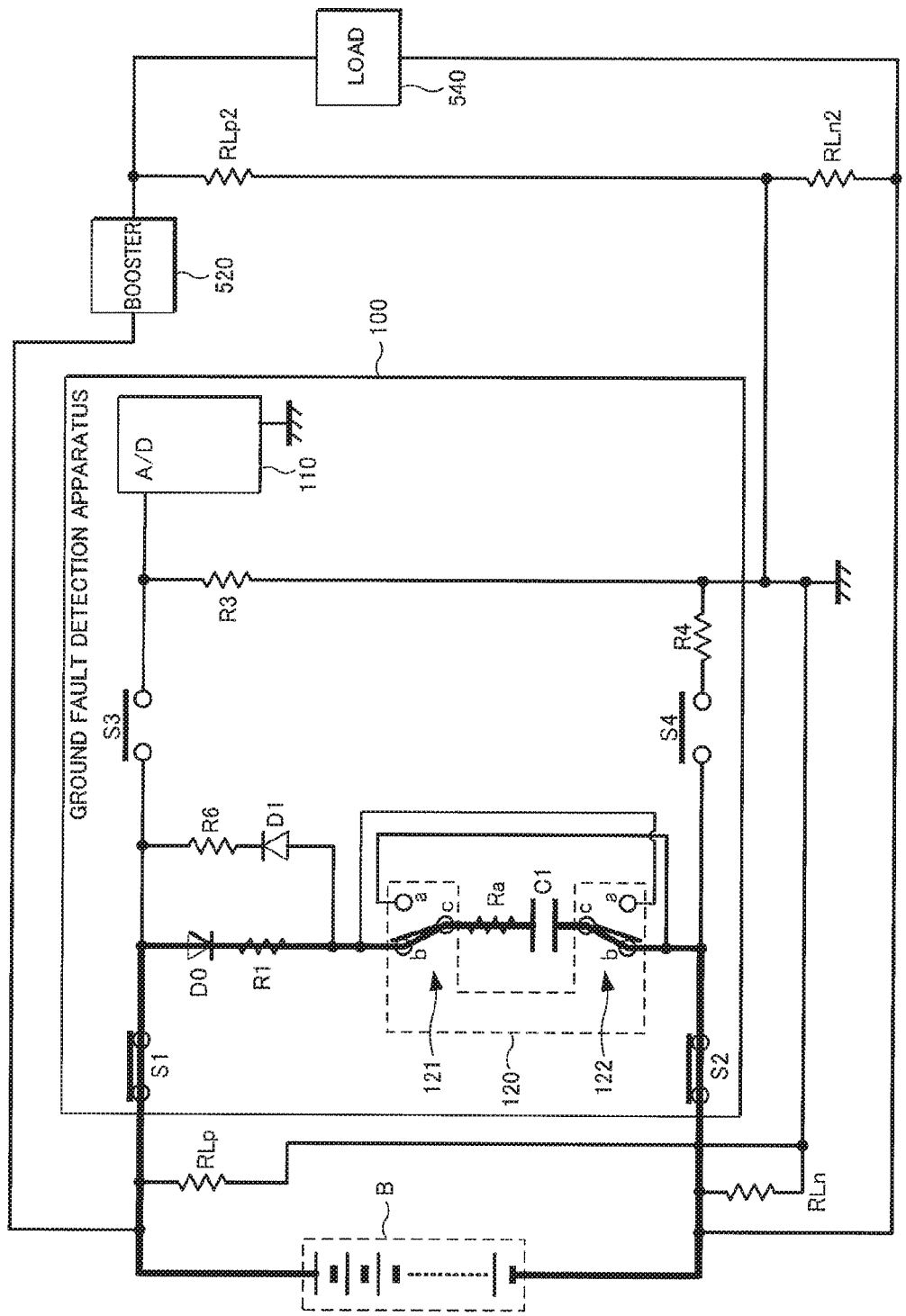
FIG. 2 is a diagram illustrating a measurement path during a V0 measurement period.

In the V0 measurement period, a voltage corresponding to a voltage of the battery B is measured. To do this, the switches S1 and S2 are turned on, the switches S3 and S4 are turned off, thereby the capacitor C1 is charged. That is, as shown in FIG. 2, the battery B and the capacitor C1 are in the measurement path. The capacitor C1 is charged in a normal polarity, and the first electrode plate of the capacitor C1 will have a higher electrical potential.

Figure 3:
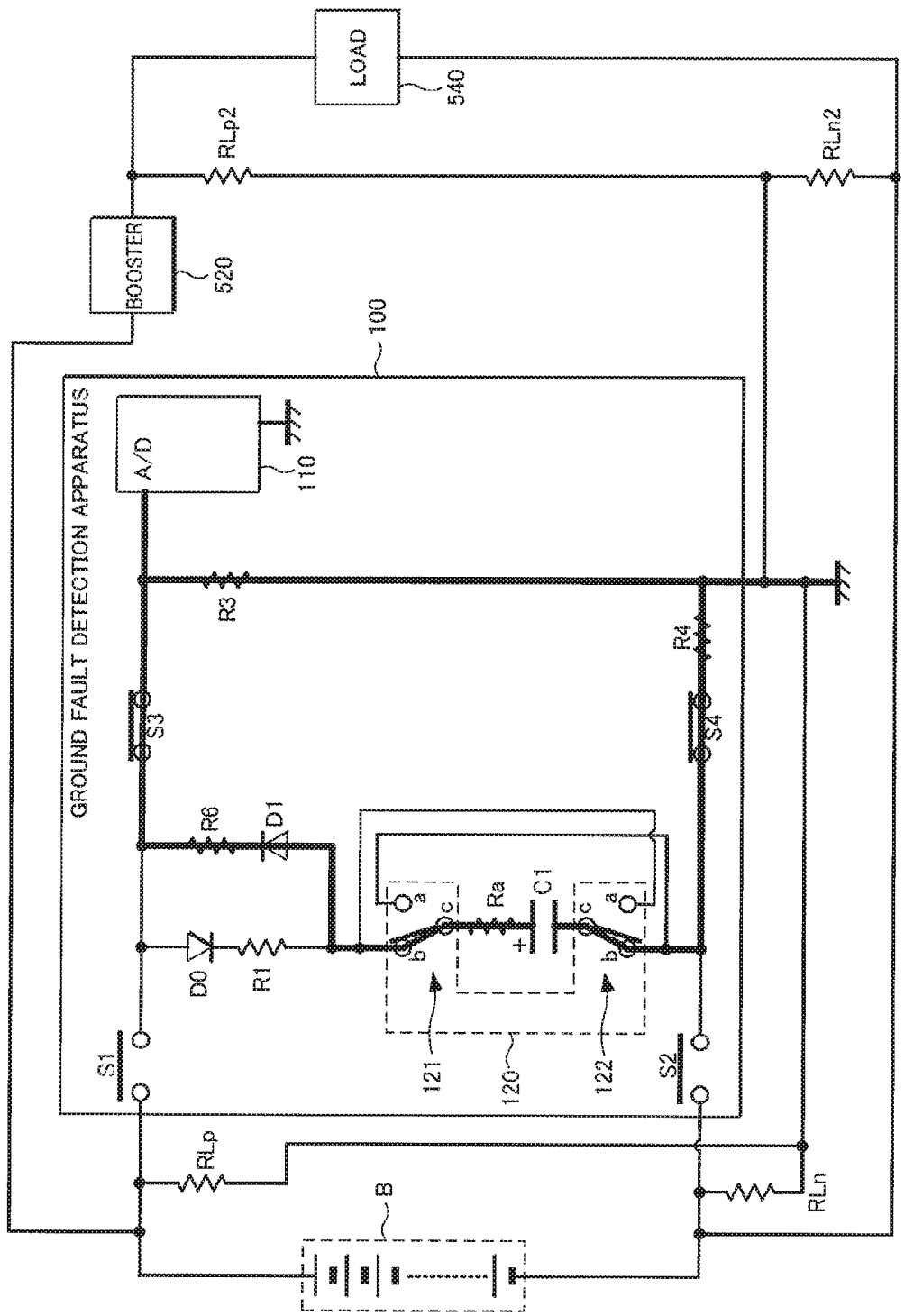
FIG. 3 is a diagram illustrating a path for measuring a charge voltage of a capacitor.

As shown in FIG. 3, during the measurement of a charge voltage of the capacitor C1, the switches S1 and S2 are turned off and the switches S3 and S4 are turned on, and sampling is performed by the control device 110, and then the capacitor C1 is discharged for a next measurement.

Figure 4:
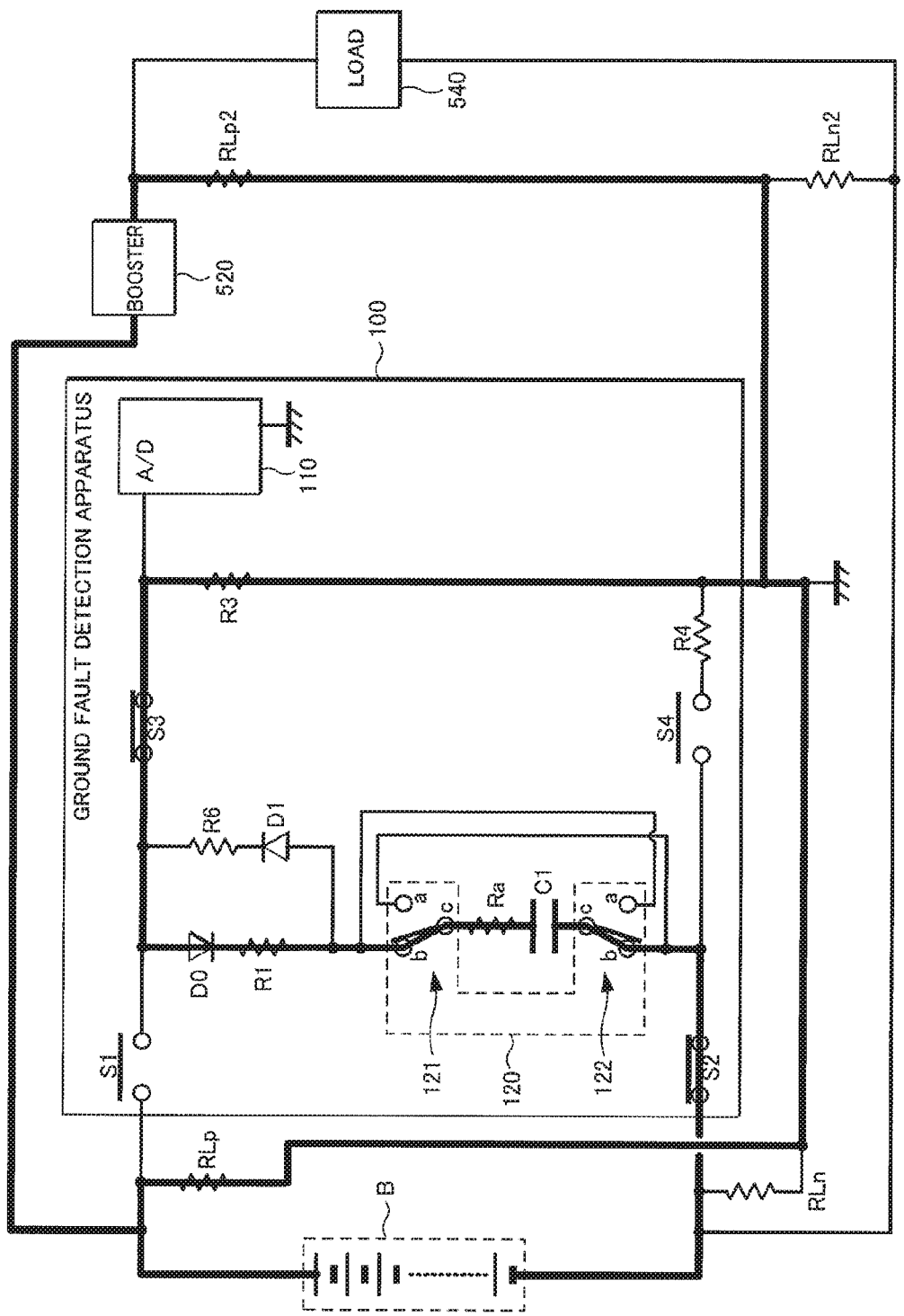
FIG. 4 is a diagram illustrating a measurement path during a Vcp measurement period.

In the Vcp measurement period, a voltage reflecting the effect of the positive electrode-side insulation resistance RLp is measured. To do this, the switches S2 and S3 are turned on and the switches S1 and S4 are turned off, and the capacitor C1 is charged. That is, as shown in FIG. 4, the battery B, a parallel circuit of the primary side positive electrode insulation resistor RLp1 and the secondary side positive electrode insulation resistor RLp2, the resistor R3 and the capacitor C1 are in the measurement path. The capacitor C1 is charged in a normal polarity, and the first electrode plate of the capacitor C1 will have a higher electrical potential. Thus, a charge voltage of the capacitor C1 is measured in the path shown in FIG. 3.

Figure 5:
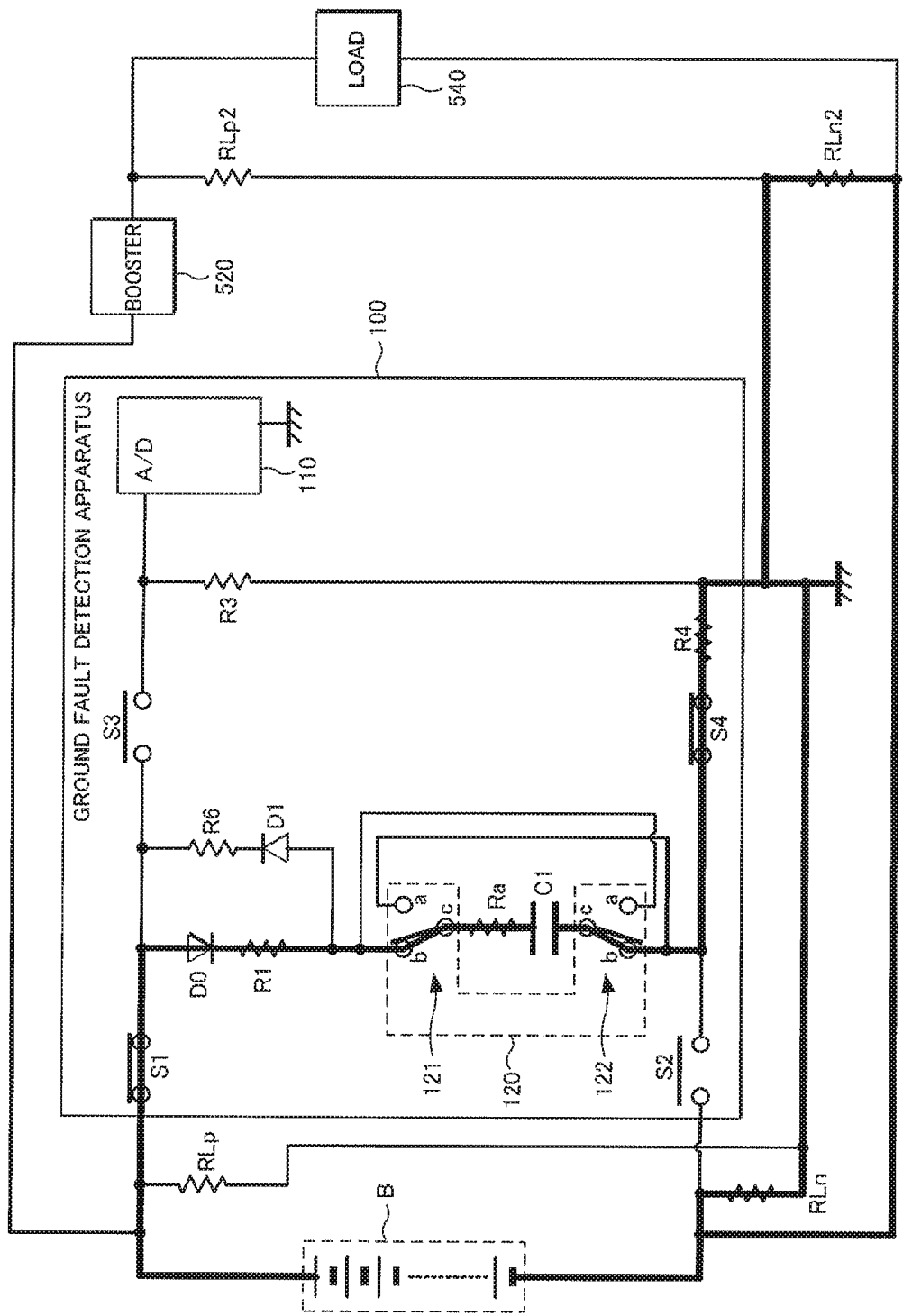
FIG. 5 is a diagram illustrating a measurement path during a Vcn measurement period.

In the Vcn measurement period, a voltage reflecting the effect of the negative electrode-side insulation resistance RLn is measured. To do this, the switches S1 and S4 are turned on and the switches S2 and S3 are turned off, and the capacitor C1 is charged. That is, as shown in FIG. 5, the battery B, the resistor R1, the capacitor C1, the resistor R4 and the negative electrode-side insulation resistance RLn are in the measurement path.

During the step up operation of the booster 520, a voltage obtained by dividing a stepped up voltage by the positive electrode-side insulation resistance RLp and the negative electrode-side insulation resistance RLn is applied to the second electrode plate of the capacitor C1. When this voltage becomes greater than a voltage applied from the positive electrode side of the battery B, the capacitor C1 will be charged with a polarity reversed to the normal polarity due to current flowing around.

In this case, when a charge voltage of the capacitor C1 is measured using the path shown in FIG. 3, the measured value will be 0V. Note that, considering the effect of noise and such, measured value equal to or less than a several tens of mV is regarded as 0V.

Figure 6:
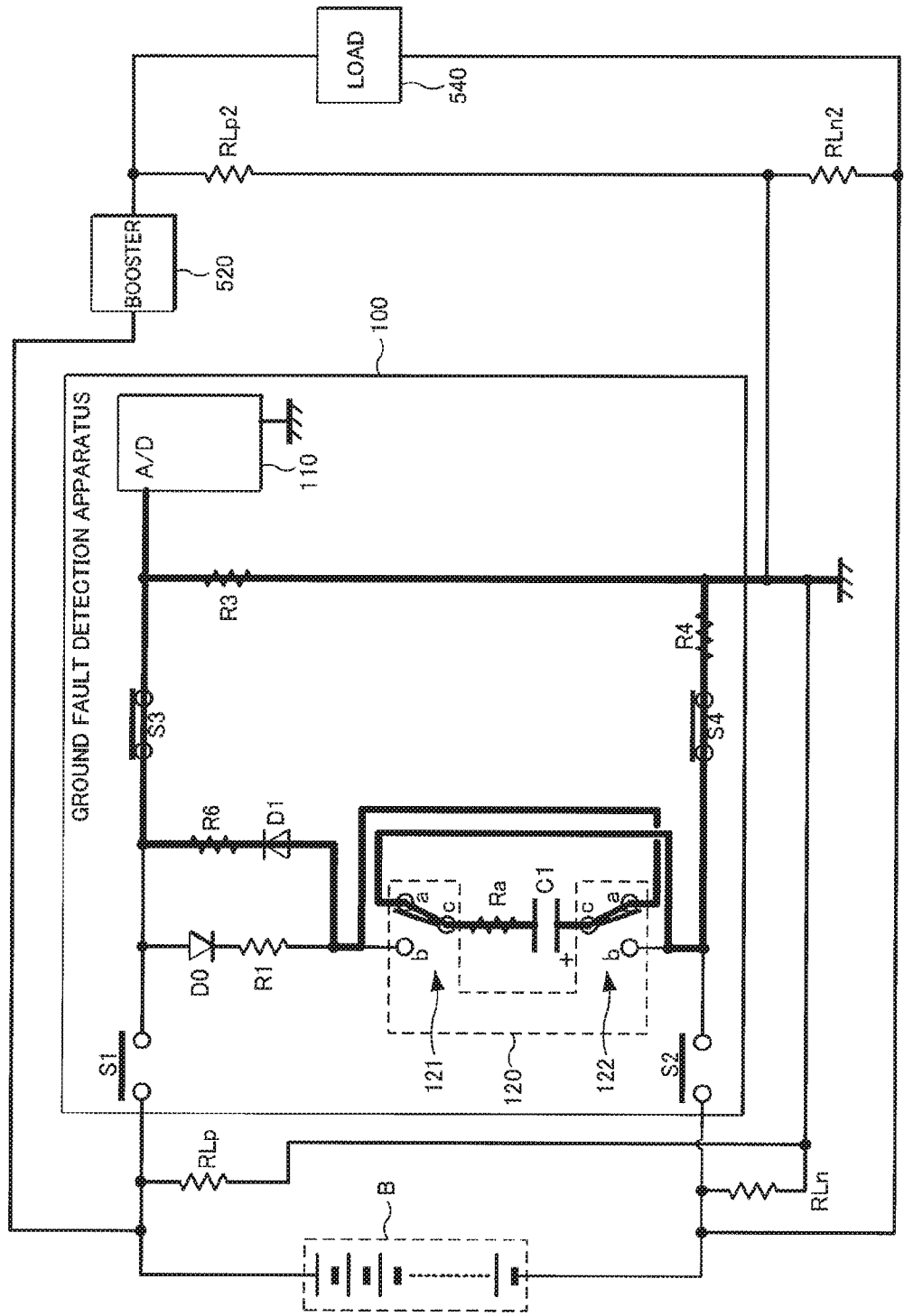
FIG. 6 is a diagram for illustrating a path for measuring a charge voltage of the capacitor charged with a reversed polarity.

Thus, the control device 110 switches the twin relay 120 to the contact point "a" side when the measured value is 0V during the Vcn measurement period. By doing so, the connection direction of the capacitor C1 is reversed as shown in FIG. 6, thus the charge voltage Vcn of the capacitor C1 charged with the reversed polarity can be measured.

On the other hand, if the current does not flow around and the capacitor C1 is charged in the normal polarity, and the measured value measured with the path shown in FIG. 3 is not 0V, then that measured value can be the charge voltage Vcn of the capacitor C1.

The control device 110 calculates the insulation resistance RL with referring to a pre-produced table data based on (Vcp+Vcn)/V0 calculated using V0, Vcn and Vcp obtained in the above-described measurement periods. Then, when the insulation resistance RL becomes equal to or below a predetermined determination reference level, it is determined that there is a ground fault occurring, and a warning is outputted to the external control device.

As described above, the ground fault detection apparatus 100 of this embodiment uses inexpensive Form C contact relays 121, 122 or the twin relay 120 to provide the path that makes the connection direction of the capacitor C1 reversed. Consequently, even when the capacitor C1 is charged with the reversed polarity, the charge voltage can be measured in an inexpensive way.

Figure 7:
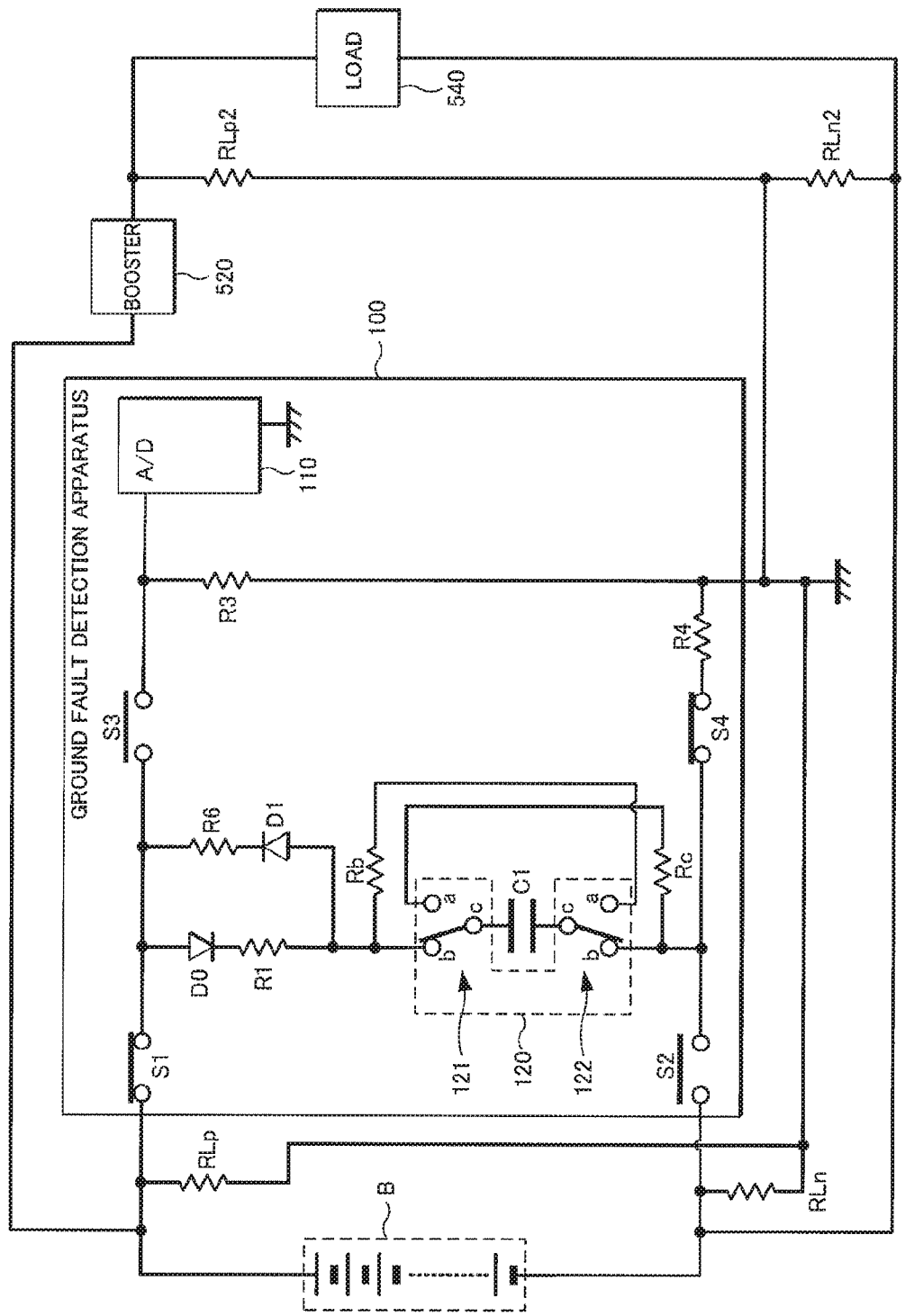
FIG. 7 is a block diagram showing another configuration of the ground fault detection apparatus of this embodiment.

A path that makes the connection direction of the capacitor C1 reversed may be configured as shown in FIG. 7. In the example shown in FIG. 7, in place of the resistor Ra, a resistor Rb is connected between the contact point "a" of the Form C contact relay 122 and the contact point "b" of the Form C contact relay 121, and a resistor Rc is connected between the contact point "a" of the Form C contact relay 121 and the contact point "b" of the Form C contact relay 122.

The resistor Rb and the resistor Rc are used as a protective resistor for preventing a short circuit in an abnormal relay operation and used as a discharge resistor with the resistor R3, the resistor R4 and the resistor R6 connected in series. For example, the resistors Rb and Rc may be configured such that Rb=Rc=R6, or they may be omitted.

As shown in FIG. 2 to FIG. 6, in the measurement paths of the respective measurement periods, the switch S1 and the switch S3 are never turned on at the same time, and the switch S2 and the switch S4 are never turned on at the same time.

Figure 8:
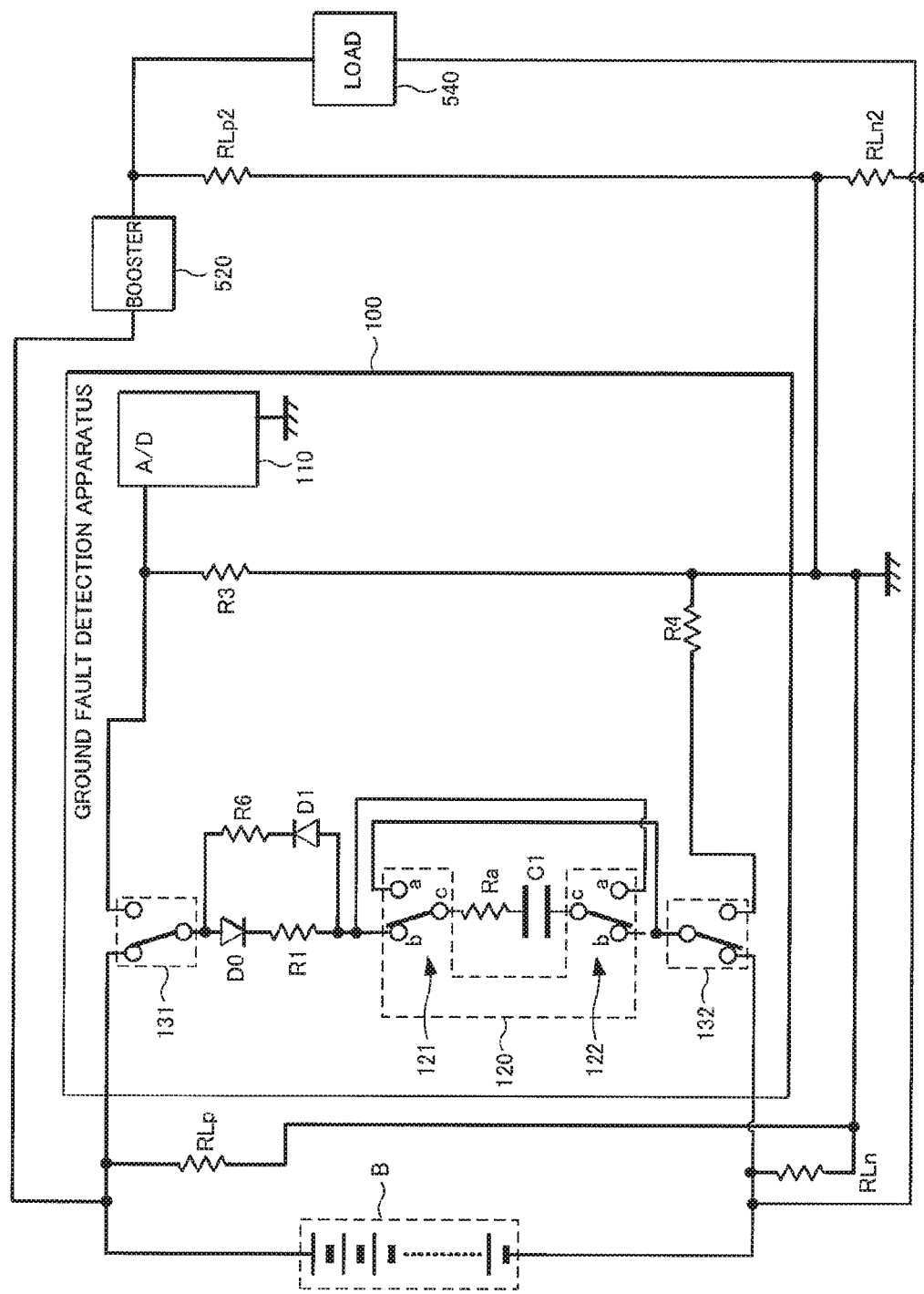
FIG. 8 is a block diagram showing another configuration of the ground fault detection apparatus of this embodiment.
Figure 9:
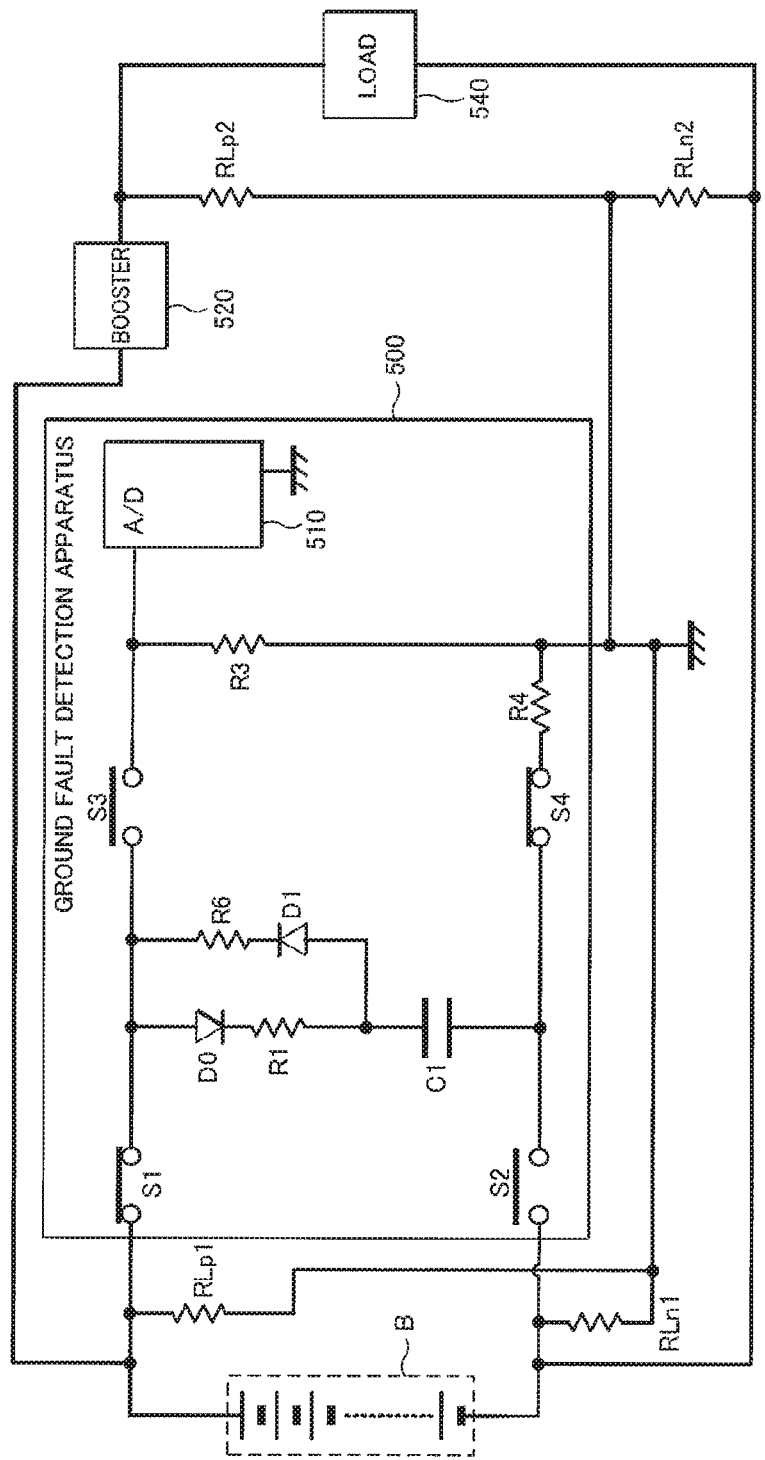
FIG. 9 is a block diagram showing a configuration example of a conventional ground fault detection apparatus of a flying capacitor type.
Figure 10:
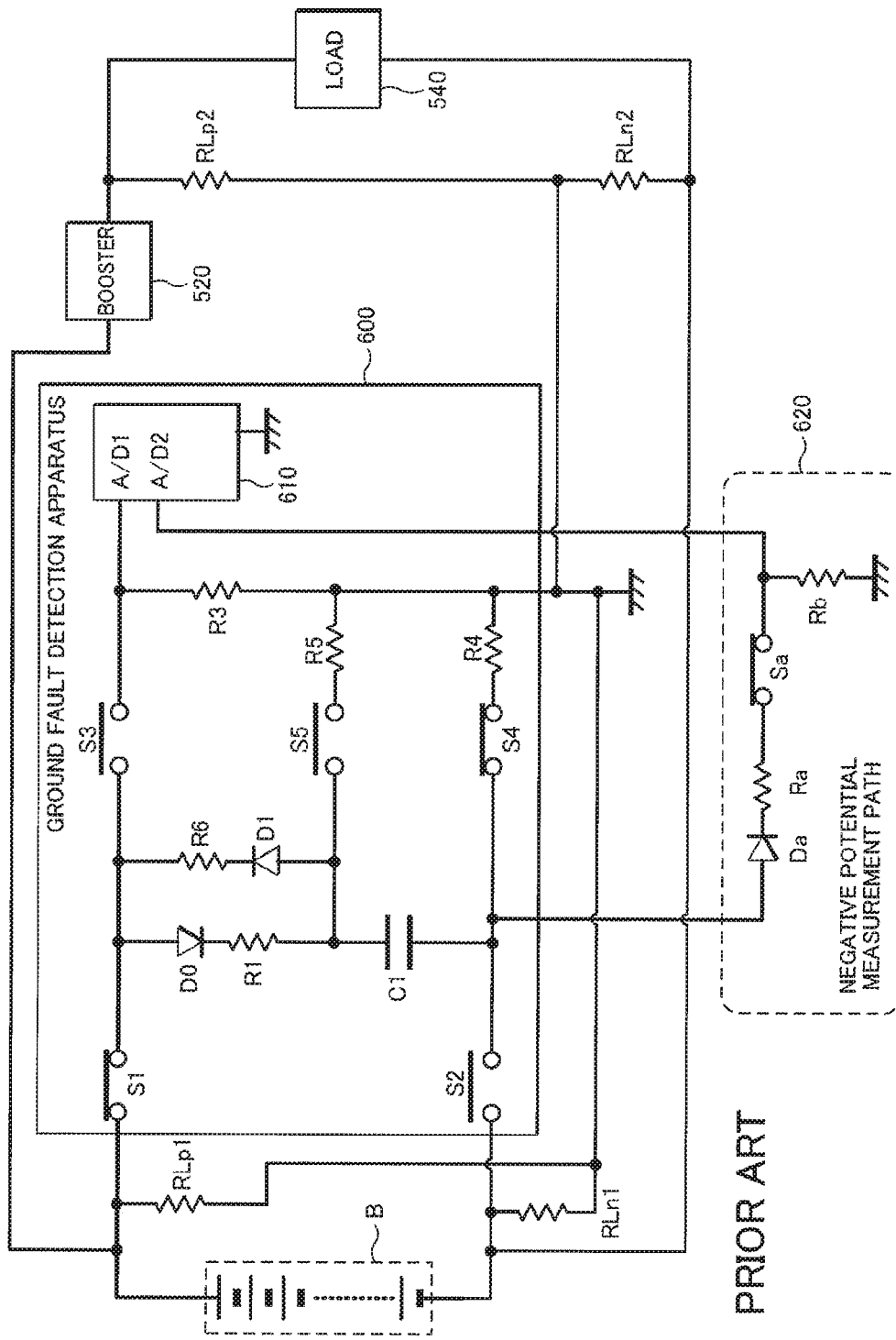
FIG. 10 is a block diagram showing a conventional configuration enabling measurement of a charge voltage even if a flying capacitor is charged with a reversed polarity.

Thus, the switch S1 and the switch S3 may be constituted of a Form C contact relay 131, and the switch S2 and the switch S4 may be constituted of a Form C contact relay 132, as shown in FIG. 8. The Form C contact relays 131, 132 are both connected such that their contact points "c" are arranged on the capacitor C1 side.

The Form C contact relays 131, 132 may be constituted of a high breakdown voltage and low signal mechanical relay or a reed relay, for example. By doing so, it is possible to omit four photo MOS-FETs that cause an increase in cost, thereby providing the ground fault detection apparatus 100 at even more low cost.

LIST OF REFERENCE SIGNS 100 ground fault detection apparatus
110 control device
120 twin relay
121 Form C contact relay
122 Form C contact relay
131 Form C contact relay
132 Form C contact relay
500 ground fault detection apparatus
510 control device
520 booster
540 load

What is claimed is:

1. A ground fault detection apparatus configured to be connected to an ungrounded battery for supplying power to a load via a step-up circuit, and configured to detect a ground fault by calculating an insulation resistance of a system provided with the battery, the ground fault detection apparatus comprising:
   a capacitor configured to operate as a flying capacitor;
   a set of switches configured to switch between a first voltage (V0) measurement path including the battery and the capacitor, a second voltage (Vcn) measurement path including the battery, the capacitor and a negative electrode-side insulation resistor as an insulation resistor between a negative electrode side of the battery and a ground, a third voltage (Vcp) measurement path including the battery, the capacitor and a positive electrode-side insulation resistor as an insulation resistor between a positive electrode side of the battery and the ground, and a capacitor charge voltage measurement path; and
   a pair of Form C contact relays configured to reverse a connection direction of the capacitor,
   wherein a contact point c of each of the pair of Form C contact relays is connected to the capacitor side, and a contact point a and a contact point b of one of the pair of Form C contact relays are connected to a contact point b and a contact point a of another one of the pair of Form C contact relays, respectively.

2. The ground fault detection apparatus according to claim 1, wherein, when a measured value of the charge voltage of the capacitor in the second voltage (Vcn) measurement path can be regarded as zero, the pair of Form C contact relays can be switched to reverse the connection direction of the capacitor.

3. The ground fault detection apparatus according to claim 2, wherein the pair of Form C contact relays is constituted of a twin relay.

4. The ground fault detection apparatus according to claim 2, the set of switches is constituted of two Form C contact relays.

5. The ground fault detection apparatus according to claim 1, wherein the pair of Form C contact relays is constituted of a twin relay.

6. The ground fault detection apparatus according to claim 5, the set of switches is constituted of two Form C contact relays.

7. The ground fault detection apparatus according to claim 1, the set of switches is constituted of two Form C contact relays.

* * * * *